Figure 1:
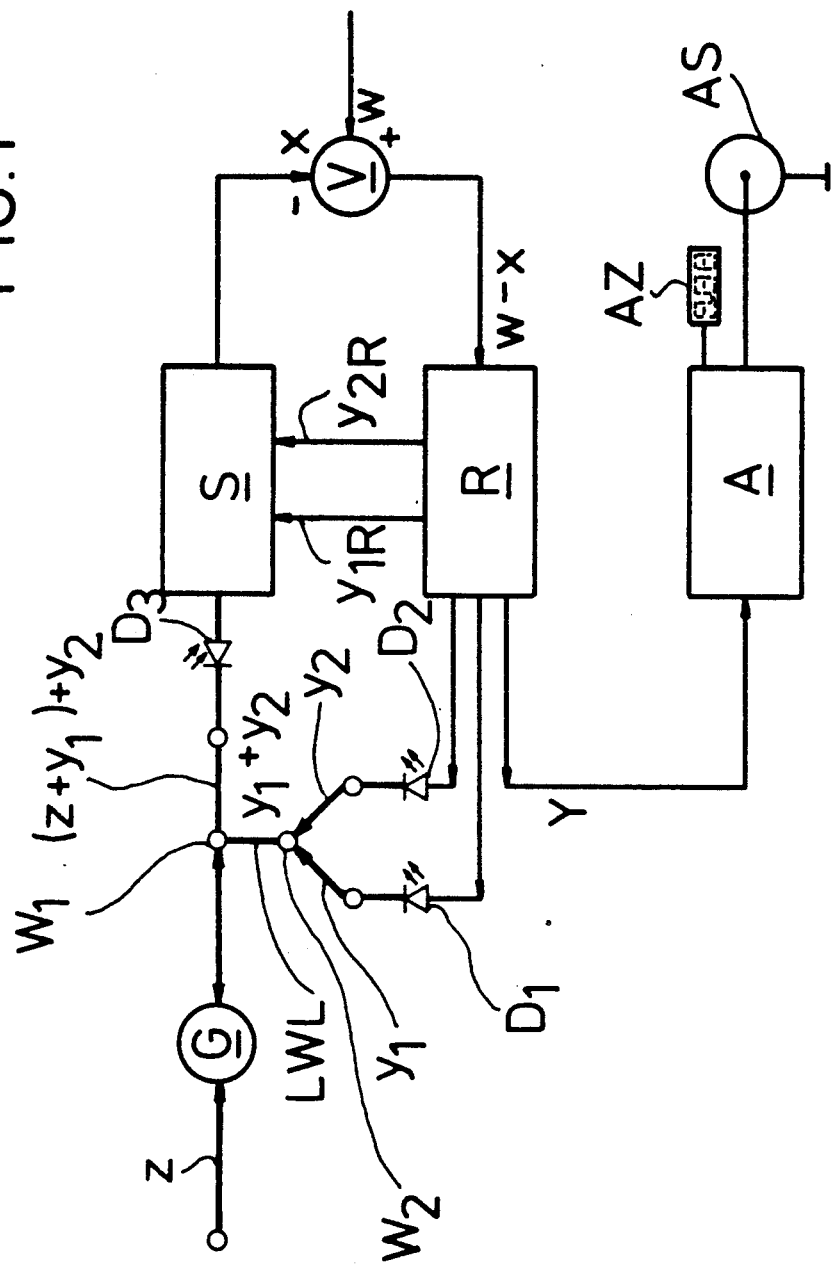

United States Patent [19]

Zimmermann et al.

[11] Patent Number: 5,019,704

[45] Date of Patent: May 28, 1991

[54] MEASURING CIRCUIT FOR DETECTING MEASUREMENT SIGNALS

[75] Inventors: Clifton Zimmermann, Karlsruhe; Heribert Kuerten, Neustadt; Helmut Lewin, Bobenheim-Roxheim, all of Fed. Rep. of Germany

[73] Assignee: BASF Aktiengesellschaft, Ludwigshafen, Fed. Rep. of Germany

[21] Appl. No.: 448,959

[22] Filed: Dec. 12, 1989

[30] Foreign Application Priority Data

Jan. 7, 1989 [DE] Fed. Rep. of Germany ....... 3900274

[51] Int. Cl.$^5$ .............................................. H01J 40/14
[52] U.S. Cl. .............................. 250/214 R; 250/227.21
[58] Field of Search ........... 250/214 A, 214 R, 227.21

[56] References Cited

U.S. PATENT DOCUMENTS 4,572,948 2/1986 Brooks ........................... 250/227.21
4,752,141 6/1988 Sun et al. ....................... 250/227.21
4,900,921 2/1990 Spillman, Jr. .................. 250/227.21

Primary Examiner—David C. Nelms
Assistant Examiner—K. Shami
Attorney, Agent, or Firm—Keil & Weinkauf

[57] ABSTRACT

A control loop comprising a control section, a set value-/actual value comparator and a controller is expanded for ultraprecision measurements in such a way that, to detect measurement signals, the control variable connection between the controller output and the control section input is guided via a measured value transducer and, to evaluate and display the measured value, the correcting variable output of the controller is additionally connected to an evaluating circuit.

4 Claims, 4 Drawing Sheets

MEASURING CIRCUIT FOR DETECTING MEASUREMENT SIGNALS

The present invention relates to a measuring circuit for detecting measurement signals which is based on a closed control loop comprising a control section, a set value/actual value comparator and a controller.

Precision measurements, for example of surface areas or layer thicknesses or in relation to bodies of rotation, have hitherto been carried out with measuring devices whose accuracy and precision are limited, in the case of mechanical measuring systems by mechanical shortcomings and, in the case of electronic measuring systems by extraneous signals, in particular by noise and drift.

It is an object of the present invention to develop a measuring circuit for detecting measurement signals which is suitable for accurate precision measurements.

We have found that this object is achieved by a control loop of the type described at the beginning, wherein the control variable connection between the controller output and the control section input is guided via a measured value transducer and the correcting variable output of the controller is additionally connected to an evaluating circuit.

In an advantageous embodiment of the measuring circuit, the control variable output of the controller is connected via an optoelectronic converter and an optical waveguide to the control section input and the optical waveguide is guided by means of an optical switch via an optical sensor.

Figure 2:
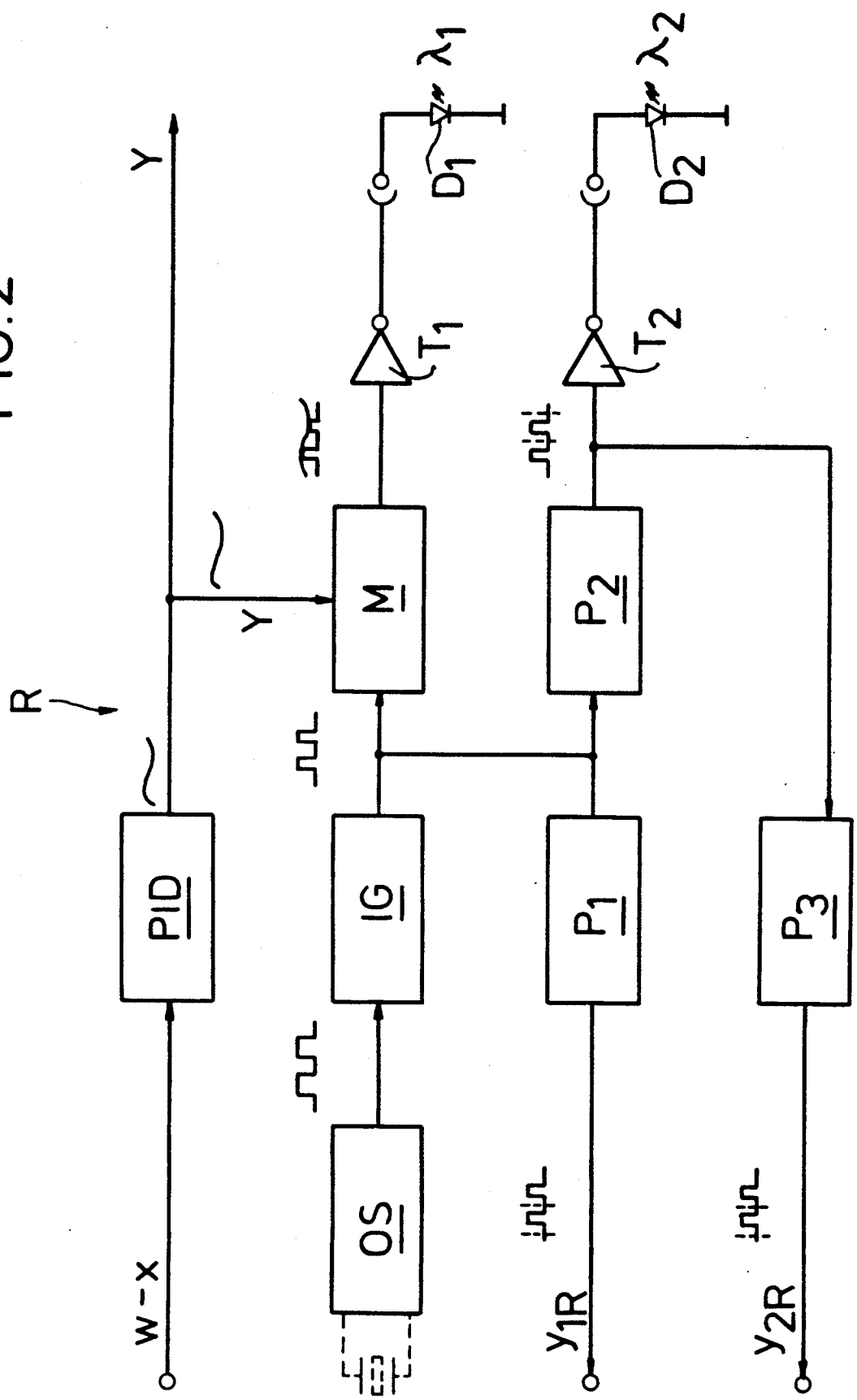
Figure 3:
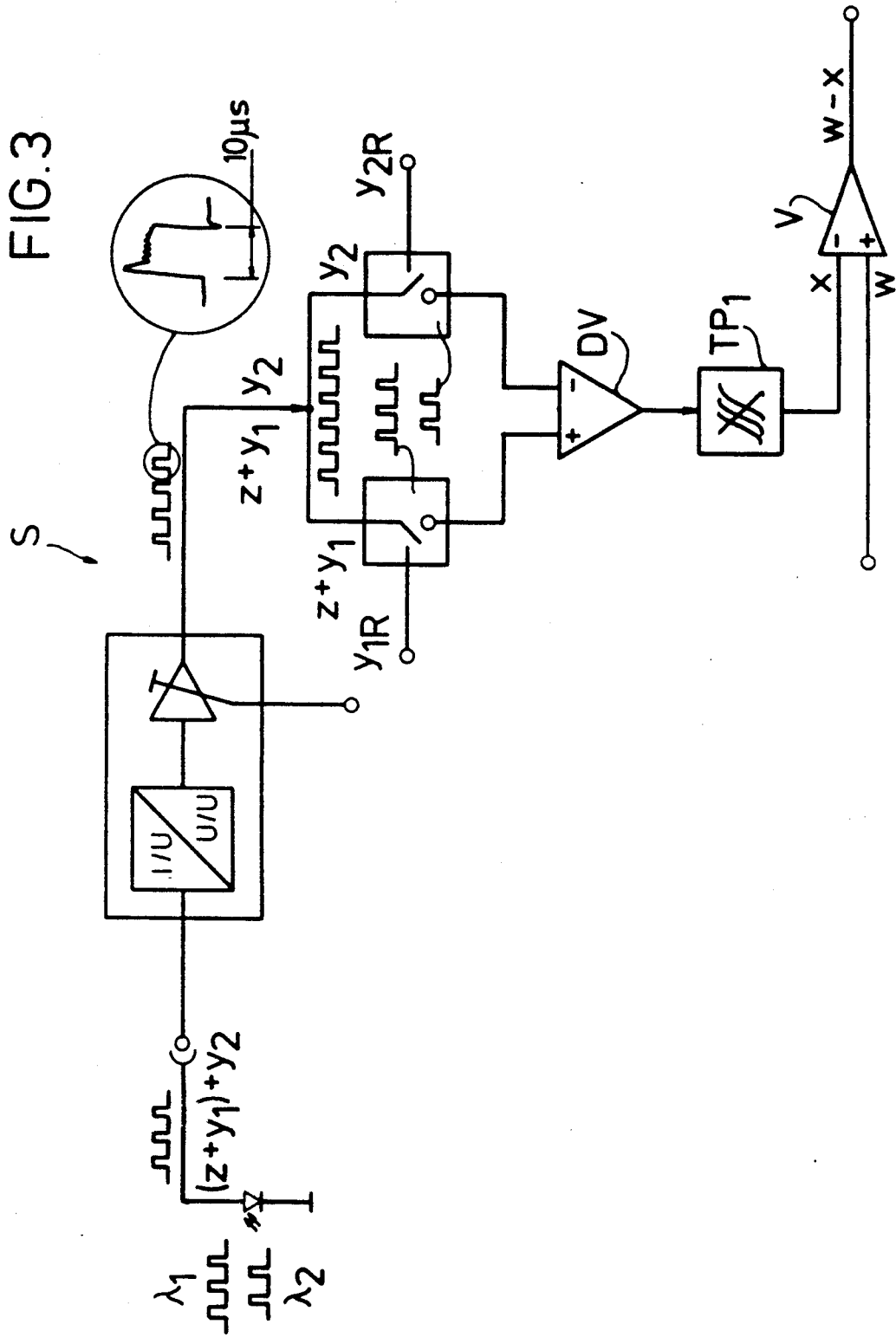
Figure 4:
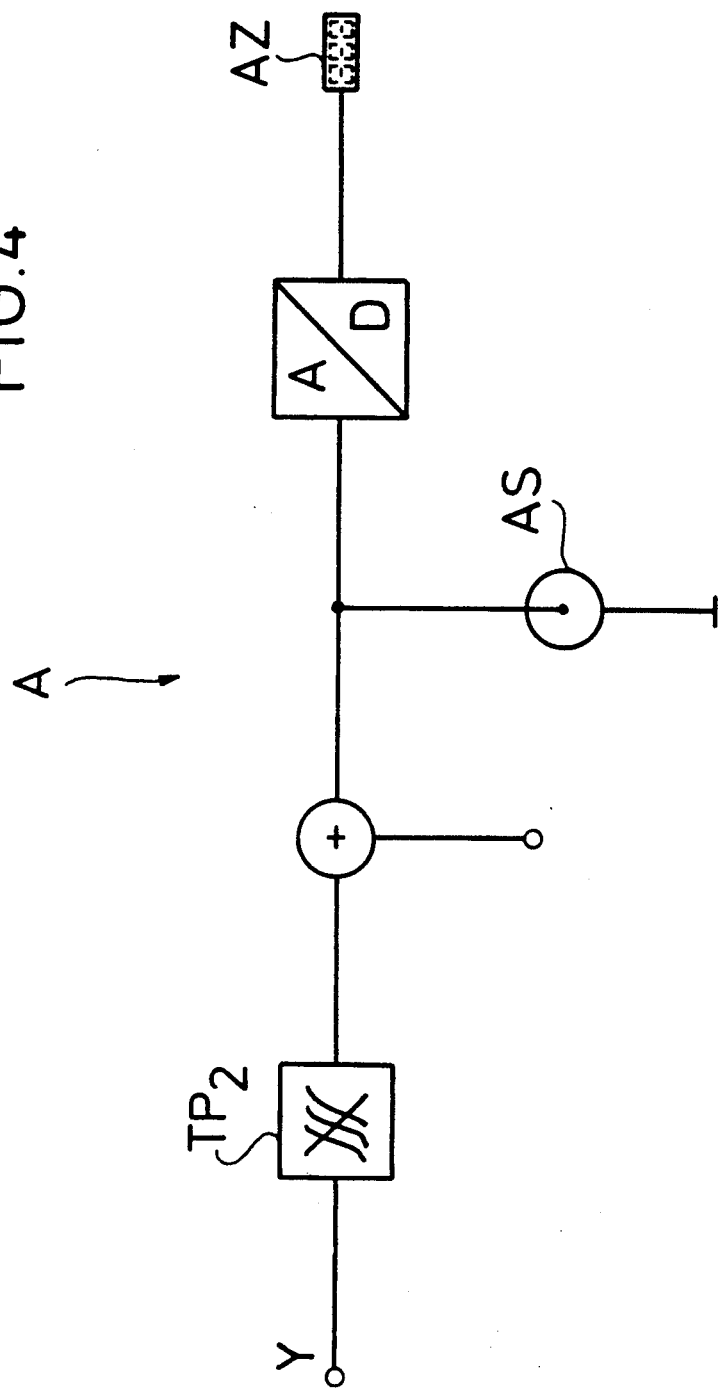

The measuring circuit according to the present invention is hereinafter described with reference to the illustrative embodiment depicted schematically in the drawing, where FIG. 1 shows a block circuit diagram of the entire measuring circuit and FIGS. 2 to 4 show the schematic construction of the individual blocks.

The central part of the measuring circuit is, as can be seen from FIG. 1, a closed control loop which consists of a control section S, a set value/actual value comparator V and a controller R. To detect measurement signals, the control variable connection between the controller output and the control section input is guided via a measured value transducer G which affects the control variable in accordance with the quantity to be measured. In the present illustrative embodiment, this connection consists of an optical waveguide LWL which is connected to the control loop by means of optoelectronic converters $D_1$ to $D_3$. The optoelectronic control loop is particularly advantageous for use in an explosion hazard zone, but can, depending on the quantity to be measured, also be closed by a direct electric or electromagnetic measuring loop. Owing to the low damping of the LWL, the sensor G can be used along way away (several kilometers) from the measuring circuit. The sensor G, for example the tip of a probe, which picks up the measured value z modulates the light pulses $y_1$ in the LWL. This is done for example by influencing the reflection of the light emerging at the end of the LWL. The reflected modulated pulse signals $z+y_1$ on the one hand and the pulse signals $y_1$ emitted by the laser diode D on the other are separated by an optical switch $W_1$, so that a photodiode $D_3$ at the input of section S receives only the modulated signals. As is explained in detail below, the controller R generates a correcting variable Y in accordance with the modulation in order that the modulation of the signal in the control section be smoothed out by counteracting readjustment of the transmitted signal. In this case the smoothing-out takes place with a time delay of not more than 10 μs, so that the response is approximately real time. The correcting variable here represents the measured value picked up by the sensor, which is processed in an evaluating circuit A for display or for some other purpose. The entire circuit of the control loop is constructed in such a way that instead of an opto-electronic measuring loop any other transmitting and receiving configuration, for example with piezoelectric or electromagnetic components, is usable without change to the circuit.

To emit light $\lambda_1$ into the LWL, the laser diode $D_1$ is triggered by pulses generated by the controller R (FIG. 2) by means of an oscillator OS whose symmetric square voltage of defined and adjustable frequency is converted in a pulse generator IG into short square pulses of a width of from 100 μs to 100 ns, depending on the oscillator frequency. The pulse generator is followed by a mixer M which has a modulation depth of 14 bits and in which the pulses are modulated according to the correcting variable Y from a PID controller. The output of the mixer is connected via a drive amplifier $T_1$ to the laser diode $D_1$ which converts the amplitude modulated pulses into light pulses $y_1$.

As mentioned, the light pulses pass through the measuring loop and, modulated by the sensor G, are converted in the receiving diode $D_3$ into electrical pulses. Owing to the high noise component of the received signal, the pulses must be subjected to a processing in the control section S (FIG. 3). To this end, a current/voltage converter I/U (input impedance about $10^{15}$ Ω, transimpedance $\leq 10^8$ V/A of voltage amplification $\leq 10^6$ V/V at a band width of from 0 to 3 MHZ ($-3$ dB)) is followed by a sampling and hold element AH where pulses $y_1$ are coherently gated by reference signals $y_{1R}$. The sampling input for the reference pulses is connected to the pulse generator IG via a delay element $P_1$ in order to compensate running time differences.

To compensate instabilities of the control loop and of the fiber-optical section there is a further sampling and hold element $AH_2$ whose signal input is supplied with pulses $y_2$ generated by a second laser diode $D_2$ connected to the LWL via an optical switch $W_2$. This laser diode $D_2$ is likewise triggered by a pulse generator IG via a delay element $P_2$ and a subsequent drive amplifier $T_2$, the delay element being determined in such a way that the pulses, $y_2$ are broadcast offset by half a cycle period between successive pulses $y_1$. Selecting a laser diode which has a different wavelength $\lambda_2$ from that of laser diode $D_1$ and which has an optical filter which transmits laser light $\lambda_1$ but reflects $\lambda_2$ at the sensor end of the LWL ensures the availability of a comparative signal $y_2$ which, like pulses $y_1$, contains instabilities and disturbances of the control loop and of the fiberoptical section, such as signal drift, noise, temperature effects and deformations of the LWL, but no measurement signal. The pulses $y_2$ are coherently gated by the reference signal $y_{2R}$ which is conducted away from the control circuit of the laser diode $D_2$ via a further delay element $P_3$.

Of the two time-shifted pulse sequences $y_1$ and $y_2$ only one is ever active at the two sampling and hold elements $AH_1$ and $AH_2$ owing to the reference signals $Y_{1R}$ and $Y_{2R}$. As a result of the sampling, the outputs of the two sampling and hold elements are signals which have been frequency transformed by $\omega_O - 2\pi/T_O$ and whose noise components have been substantially suppressed except for higher, in-phase harmonics $\omega_i$. The subsequent difference amplifier DV compensates the troublesome DC component which is present to the same extent in the two output signals, so that the output of the low pass filter $TP_1$, which follows the amplifier, is the actual value x of the control loop.

From the actual value x and a set value w the set value/actual value comparator V in the form of a different amplifier forms the error signal w-x, which is passed to the PID controller. From this the PID controller produces the correcting variable Y with which the pulses from the pulse generator IG are modulated in the mixer M in such a way that the difference w-x is equal to zero at the output of the comparator.

However, the variable Y also represents the actual measurement signal which, as mentioned, is sent to an evaluating circuit A (FIG. 4) to display the value of the measurement variable or for a further measured value processing. This unit comprises a low pass filter $TP_2$ whose output is a smoothed signal. The output is connected to a display unit AZ, for example a digital display unit incorporating an upstream analog/digital converter A/D, and to an analog signal output AS. If necessary, the connection between the low pass filter output and the display unit has an offset compensation to be able to set the measured signal to zero at any desired point.

We claim:

1. A measuring circuit for detecting measurement signals, comprising a closed control loop with a control section, a set value/target value comparator and a controller, said control section and said controller each having input means and output means, wherein the control variable connection between the controller output means and the control section input means is connected to and controlled by a measured value transducer wherein the controller output means includes a correcting variable output which is connected to an evaluation circuit.

2. A measuring circuit as claimed in claim 1, wherein the control variable connection between the controller output means and the control section input means includes an optoelectronic converter and an optical waveguide and the optical waveguide is connected by way of an optical switch to said measured value transducer, said transducer being in the form of an optical sensor.

3. A measuring circuit as claimed in claim 1, wherein, to detect the measurement signals, there is a source of reference signals whereby the measurement signals can be coherently gated in the control section with the aid of a sampling and hold element.

4. A measuring circuit as claimed in claim 3, wherein, to compensate instabilities of the control loop and of the fiber-optical section, said controller includes a pulse signal source, wherein there is provided a second optoelectronic converter which is triggerable by said signal source via a delay element and whose signals are coupled into the optical waveguide between the successive signal pulses transmitted by the first optoelectronic converter, at a wavelength which differs from that of the signal pulses transmitted by said first optoelectronic converter and which is reflected by a filter arranged immediately upstream of said measured value transducer and, downstream of an optical converter, are sampled in a second sampling and hold element with the aid of the signals from the second source of reference signals, and the outputs of the two sampling and hold elements are connected to a difference amplifier whose output is passed to a low pass filter.

* * * * *